United States Patent
Ahn et al.

(10) Patent No.: US 6,953,745 B2
(45) Date of Patent: Oct. 11, 2005

(54) VOID-FREE METAL INTERCONNECTION STRUCTURE AND METHOD OF FORMING THE SAME

(75) Inventors: Jeong-hoon Ahn, Gwacheon-si (KR); Hyo-jong Lee, Seoul (KR); Kyung-tae Lee, Seoul (KR); Kyoung-woo Lee, Seoul (KR); Soo-geun Lee, Suwon-si (KR); Bong-seok Suh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/891,062

(22) Filed: Jul. 15, 2004

(65) Prior Publication Data

US 2005/0029010 A1 Feb. 10, 2005

(30) Foreign Application Priority Data

Aug. 4, 2003 (KR) ................................. 10-2003-0053890

(51) Int. Cl.$^7$ ......................................... H01L 21/4763
(52) U.S. Cl. ....................... 438/637; 438/627; 438/638; 438/634; 257/774
(58) Field of Search ................................. 438/637–638, 438/627, 634; 257/774

(56) References Cited

U.S. PATENT DOCUMENTS 6,144,099 A * 11/2000 Lopatin et al. ............. 257/758
6,184,128 B1 * 2/2001 Wang et al. ................ 438/637
6,214,696 B1 * 4/2001 Wu ............................ 438/424
6,486,059 B2 * 11/2002 Lee et al. ................... 438/637
6,713,874 B1 * 3/2004 Hopper et al. ............. 257/760

FOREIGN PATENT DOCUMENTS

KR          2002-0053610          7/2002

* cited by examiner

Primary Examiner—Luan Thai
(74) Attorney, Agent, or Firm—Volentine Francos & Whitt, PLLC (57) ABSTRACT

A metal interconnection structure includes a lower metal interconnection layer disposed in a first inter-layer dielectric layer. An inter-metal dielectric layer having a via contact hole that exposes a portion of surface of the lower metal layer pattern is disposed on the first inter-layer dielectric layer and the lower metal layer pattern. A second inter-layer dielectric layer having a trench that exposes the via contact hole is formed on the inter-metal dielectric layer. A barrier metal layer is formed on a vertical surface of the via contact and the exposed surface of the second lower metal interconnection layer pattern. A first upper metal interconnection layer pattern is disposed on the barrier metal layer, thereby filling the via contact hole and a portion of the trench. A void diffusion barrier layer is disposed on the first metal interconnection layer pattern and a second upper metal interconnection layer pattern is disposed on the void diffusion barrier layer to completely fill the trench.

20 Claims, 9 Drawing Sheets

VOID-FREE METAL INTERCONNECTION STRUCTURE AND METHOD OF FORMING THE SAME

CROSS REFERENCES TO RELATED APPLICATIONS

This application claims priority under 35 U.S.C. § 119 from Korean Patent Application No. 2003-53890 filed on Aug. 4, 2003, the contents of which are hereby incorporated by reference in their entirety for all purposes as if fully set forth herein.

BACKGROUND AND SUMMARY

1. Technical Field

The present invention relates to a metal interconnection structure and a method of forming the same, and more particularly, to a metal interconnection structure in which formation of voids in a via contact are prevented and a method of forming the same.

2. Description of the Related Art

In order to achieve high speed semiconductor devices, copper has been used more prominently than aluminum as a interconnection material. Since aluminum has a specific resistance of 2.74 $\mu\Omega$-cm while that of copper is 1.72 $\mu\Omega$-cm, a semiconductor device which employs copper interconnections has a higher performance than a semiconductor device having aluminum interconnections. Moreover, copper interconnection can be used with an inter-metal dielectric layer having a low dielectric constant since a copper interconnection can be formed at a low temperature, thereby remarkably reducing RC delay. However, forming a copper interconnection pattern is more difficult than forming an aluminum interconnection pattern because etching copper is more difficult than etching aluminum. However, this problem has been substantially solved by using a damascene process.

To form a copper interconnection using a damascene process, an inter-metal dielectric layer pattern and an inter-layer dielectric layer pattern are sequentially formed on a lower copper interconnection layer. The inter-metal dielectric layer pattern has a via contact hole that exposes a portion of the lower copper interconnection layer, and the inter-layer dielectric layer pattern has a trench that exposes the via contact hole. In this state, a barrier metal layer is formed, and then a copper interconnection layer, is formed to completely fill the trench and the via contact hole. After performing a planarizing process, an upper copper interconnection layer is complete.

However, in the damascene process for forming a copper interconnection, stress is generated in the copper interconnection due to shrinkage caused by thermal stress and crystal growth. This stress may not be a severe problem when the width of the upper copper interconnection layer is narrow, that is, when there are few vacancies within the upper copper interconnection layer. However, when the width of the upper copper interconnection layer is large, that is, when there are many vacancies within the upper copper interconnection layer, voids or vacancies are formed in the via contact hole due to a stress gradient. The vacancies within the upper metal layer gather by diffusing through interfaces of crystals. When there are voids within the upper copper metal interconnection, the interconnection can become disconnected, thereby degrading the reliability of the semiconductor device.

Accordingly, it would be desirable to provide a metal interconnection structure in which formation of a void is prevented. It would also be desirable to provide a method of forming a metal interconnection structure in which formation of a void in a via contact is prevented by using a damascene process.

According to one aspect of the present invention, a metal interconnection structure comprises: a lower metal interconnection layer pattern disposed in a first inter-layer dielectric layer; an inter-metal dielectric layer on the first inter-layer dielectric layer and the lower metal interconnection layer pattern, the inter-metal dielectric layer having a via contact hole that exposes a portion of an upper surface of the lower metal interconnection layer pattern; a second inter-layer dielectric layer on the inter-metal dielectric layer, the second inter-layer dielectric layer having a trench that exposes a portion of the via contact hole; a barrier metal layer on exposed lateral surfaces of the via contact hole and the exposed portion of the upper surface of the lower metal interconnection layer pattern; a first upper metal interconnection layer pattern having a first thickness on the barrier metal layer, the first upper metal interconnection layer pattern completely filling the via contact hole and partially filling the second trench; a void diffusion barrier layer on the first upper metal interconnection layer pattern; and a second upper metal interconnection layer pattern that completely fills the trench on the void diffusion barrier layer.

Beneficially, the lower metal interconnection layer pattern, the first upper metal interconnection layer pattern; and the second upper metal interconnection layer pattern comprise copper.

Beneficially, the inter-metal dielectric layer is a low dielectric constant material layer having a dielectric constant less than 3.

Beneficially, the barrier metal layer is formed of at least one material layer selected from the group consisting of a tantalum layer, a tantalum nitride layer, a titanium layer, and a titanium nitride layer.

Beneficially, the void diffusion barrier layer is formed of at least one material layer selected from the group consisting of a tantalum layer, a titanium layer, and an aluminum layer.

Beneficially, the second upper metal interconnection layer pattern is at least five times thicker than the first upper metal interconnection layer pattern.

According to another aspect of the present invention, a metal interconnection structure comprises: first and second lower metal interconnection layer patterns disposed in a first inter-layer dielectric layer with a distance therebetween; an inter-metal dielectric layer on the first inter-layer dielectric layer and the first and second lower metal interconnection layer patterns, the inter-metal dielectric layer having a first via contact hole that exposes a portion of a surface of the first lower metal interconnection layer pattern, and a second via contact hole that exposes a portion of a surface of the second lower metal interconnection layer pattern; a second inter-layer dielectric layer on the inter-metal dielectric layer, the second inter-layer dielectric layer having a first trench that exposes the first via contact hole, and a second trench that exposes the second via contact hole and has a larger width than the first trench; a first barrier metal layer on inner surfaces of the first trench and the first via contact hole, and on the exposed portion of the surface of the first lower metal interconnection layer pattern; a first upper metal interconnection pattern on the first barrier metal layer, the first upper metal interconnection pattern filling the first trench and the first via contact hole; a second barrier metal layer on inner surfaces of the second trench and second via contact hole and on the exposed portion of the surface of the second lower metal interconnection layer pattern; a second upper metal interconnection layer pattern on the second barrier metal layer and having a third trench therein, the second upper metal interconnection layer pattern filling the second via contact hole and a portion of the second trench; a void diffusion barrier layer on the second upper metal interconnection layer pattern; and a third upper metal interconnection layer pattern on the void diffusion barrier layer, the third upper metal interconnection layer pattern filling the third trench.

According to still another aspect of the present invention, a metal interconnection structure comprises: a lower metal interconnection layer pattern disposed in an first inter-layer dielectric layer; an inter-metal dielectric layer on the first inter-layer dielectric layer and the lower metal interconnection layer pattern, the inter-metal dielectric layer having a via contact hole that exposes a portion of the lower metal interconnection layer pattern; a barrier metal layer formed on exposed surfaces of the via contact hole and the exposed portion of the lower metal interconnection layer pattern; a via contact that fills the via contact hole and is disposed on the barrier metal layer; a second inter-layer dielectric layer that has a trench that exposes a portion of the inter-metal dielectric layer and an upper surface of the via contact, and is disposed on the inter-metal dielectric layer and the via contact; a first upper metal interconnection layer pattern having a first thickness that fills the via contact and a portion of the trench of the second inter-layer dielectric layer; a void diffusion barrier layer on the first upper metal interconnection layer pattern; and a second upper metal interconnection layer pattern having a second thickness that completely fills the trench and is disposed on the void diffusion barrier layer.

Beneficially, the thickness of the second upper metal interconnection layer pattern is at least five times greater than the thickness of the first upper metal interconnection layer pattern.

According to yet another aspect of the present invention, a metal interconnection structure comprises: first and second lower metal interconnection layer patterns disposed in a first inter-layer dielectric layer with a distance therebetween; an inter-metal dielectric layer on the first inter-layer dielectric layer and the first and second lower metal interconnection layer patterns, the inter-metal dielectric layer having a first via contact hole that exposes a portion of the first lower metal interconnection layer pattern and a second via contact hole that exposes a portion of the second lower metal interconnection layer pattern; first and second barrier metal layers in the first via contact hole and the second via contact hole, respectively; first and second via contacts that respectively fill the first and second via contact holes, and are disposed on the first and second barrier metal layers; a second inter-layer dielectric layer that is disposed on the inter-metal dielectric layer and has a first trench that exposes an upper surface of the first via contact and a second trench that exposes an upper surface of the second via contact, a first upper metal interconnection layer pattern that fills the first trench, a second upper metal interconnection layer pattern that forms a third trench in the second trench by filling a portion of the second trench; a void diffusion barrier layer on the second upper metal interconnection layer pattern; and a third upper metal interconnection layer pattern that fills the third trench and is disposed on the void diffusion barrier layer.

According to a further aspect of the present invention, a method of forming a metal interconnection structure comprises: forming first and second lower metal interconnection layer patterns with a distance between each other in a first inter-layer dielectric layer; forming an inter-metal dielectric layer on the first inter-layer dielectric layer and the first and second lower metal interconnection layer patterns; forming a second inter-layer dielectric layer on the inter-metal dielectric layer; forming first and second trenches that expose portions of the inter-metal dielectric layer by etching portions of the second inter-layer dielectric layer; forming a first contact hole that exposes a portion of the first lower metal interconnection layer pattern in the first trench, and a second contact hole that exposes a portion of the second lower metal interconnection layer pattern, by etching the portions of the inter-metal dielectric layer exposed by the first and second trenches; forming a barrier metal layer on inner surfaces of the first trench, the second trench, the first contact hole, and the second contact hole, and on exposed surfaces of the first and second lower metal interconnection layer patterns; forming a first upper metal interconnection layer on the barrier metal layer, thereby filling the first contact hole, the second contact hole and the first trench, and partially filling the second trench, thereby forming a third trench; forming a void diffusion barrier layer on a portion of the first upper metal interconnection layer that has the third trench; forming a second upper metal interconnection layer on the void diffusion barrier layer, thereby filling the third trench; and dividing the first upper metal interconnection layer in the first trench from the first upper metal interconnection layer in the second trench and the second upper metal interconnection layer in the third trench by removing portions of the first upper metal interconnection layer, the void diffusion barrier layer, and the second upper metal interconnection layer.

Beneficially, the inter-metal dielectric layer is formed of a low dielectric constant material having a dielectric constant less than 3.

Beneficially, the first trench is narrower than the second trench.

Beneficially, the barrier metal layer is formed of at least one metal layer selected from a group consisting of a tantalum layer, a tantalum nitride layer, a titanium layer, and a titanium nitride layer.

Beneficially, the first upper metal interconnection layer is formed by an electroplating method.

Beneficially, the void diffusion barrier layer is formed of at least one material layer selected from a group consisting of a tantalum layer, a titanium layer, and an aluminum layer.

Beneficially, the void diffusion barrier layer is formed by using PVD, CVD, or ALD.

Beneficially, the portions of the first upper metal interconnection layer, the void diffusion barrier layer, and the second upper metal interconnection layer are removed by a CMP process.

Beneficially, the first and second upper metal interconnection layers comprise copper.

According to a still further aspect of the present invention, a method of forming a metal interconnection structure comprises: forming first and second lower metal interconnection layer patterns with a distance therebetween in a first inter-layer dielectric layer; forming an inter-metal dielectric layer on the first inter-layer dielectric layer and the first and second lower metal interconnection layer patterns; forming a first contact hole and a second contact hole that expose the first and second lower metal interconnection layer patterns, respectively, by removing a portion of the inter-metal dielectric layer; forming a barrier metal layer on exposed surfaces of the inter-metal dielectric layer and the first and second lower metal interconnection layer patterns; forming a metal layer on the barrier metal layer, thereby filling the first contact hole and the second contact hole, dividing the metal layer into a first via contact in the first contact hole and a second via contact in the second contact hole by planarization; forming a second inter-layer dielectric layer on the inter-metal dielectric layer, the first via contact, and the second via contact; forming a first trench and a second trench that expose portions of upper surfaces of the first via contact and the second via contact, respectively, by removing portions of the second inter-layer dielectric layer; forming a first upper metal interconnection layer that completely fills the first trench and fills a portion of the second trench, thereby forming a third trench therein; forming a void diffusion barrier layer on the first upper metal interconnection including the third trench, forming a second upper metal interconnection layer on the void diffusion barrier layer, filling the third trench, and dividing the first upper metal interconnection layer in the first trench from the first upper metal interconnection layer in the second trench and the second upper metal interconnection layer in the third trench by planarizing.

DETAILED DESCRIPTION

Figure 1:
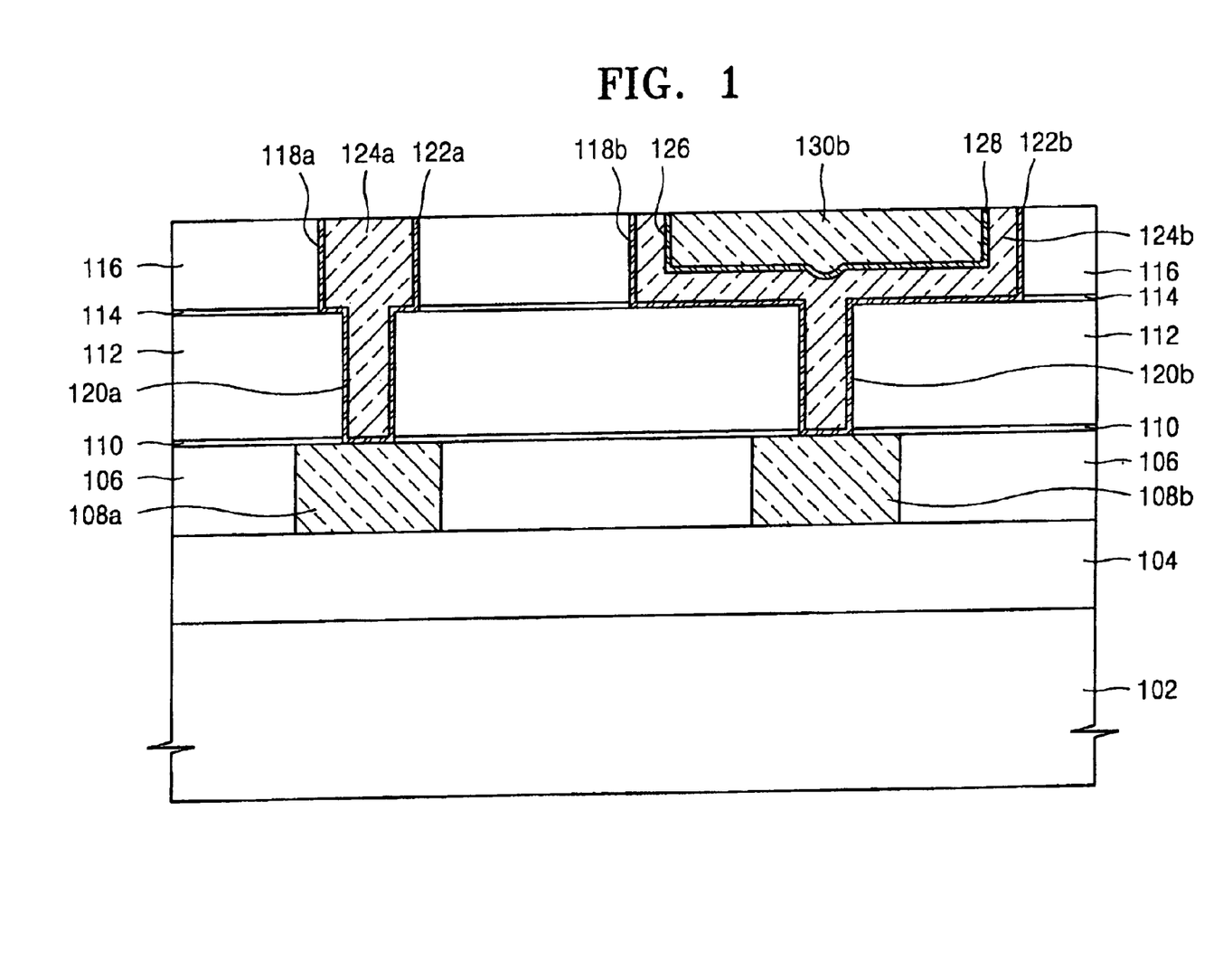
FIG. 1 is a cross-sectional view of a first embodiment of a metal interconnection structure.

FIG. 1 is a cross-sectional view of a first embodiment of a metal interconnection structure.

Referring to FIG. 1, a first lower metal interconnection layer pattern 108a and a second lower metal interconnection layer pattern 108b are disposed with a distance therebetween in a first inter-layer dielectric layer 106. In FIG. 1, the first lower metal interconnection layer pattern 108a and the second lower metal interconnection layer pattern 108b are separated. However, they can be connected in other parts. Also, the first lower metal interconnection layer pattern 108a and the second lower metal interconnection layer pattern 108b are separated from a semiconductor substrate 102 by an dielectric layer 104 interposed therebetween, but, in general, the first and second lower metal interconnection layer pattern 108a and 108b can be connected to a predetermined region, such as an active region, in the substrate 102 a via contact. The first and second lower metal interconnection layer patterns 108a and 108b may be copper layer patterns.

An inter-metal dielectric layer 112 is disposed on the first inter-layer dielectric layer 106, the first lower metal interconnection layer pattern 108a, and the second lower metal interconnection layer pattern 108b. The inter-metal dielectric layer 112 is a low dielectric constant material layer having a dielectric constant less than 3, thus reducing an RC delay. The inter-metal dielectric layer 112 has a first via contact hole 120a and a second via contact hole 120b. The first via contact hole 120a exposes a portion of the first lower metal interconnection layer pattern 108a through the inter-metal dielectric layer 112. The second via contact hole 120b exposes a portion of the second lower metal interconnection layer pattern 108b through the inter-metal dielectric layer 112. A first etch stop layer 110 is disposed under the inter-metal dielectric layer 112 and limits etching when etching for making the first via contact hole 120a and the second via contact hole 120b.

A second inter-layer dielectric layer 116 is disposed on the inter-metal dielectric layer 112. The second inter-layer dielectric layer 116 has a first trench 118a and a second trench 118b. The first trench 118a completely exposes the first via contact hole 120a through the second inter-layer dielectric layer 116. A width or a cross-sectional area of the first trench 118a is larger than that of the first via contact hole 120a. The second trench 118b completely exposes the second via contact hole 120b through the second inter-layer dielectric layer 116. A width or a cross-sectional area of the second trench 118b is larger than that of the second via contact hole 120b. The width or cross-sectional area of the second trench 118b is much larger than that of the first trench 118a, and the reason will be described later. A second etch stop layer 114 is disposed under the second inter-layer dielectric layer 116. The second etch stop layer 114 is a layer that limits etching when etching for making the first trench 118a and the second trench 118b.

A first barrier metal layer 122a is disposed on exposed surfaces of the first via contact hole 120a, the first trench 118a, and the first lower metal interconnection layer pattern 108a. The first barrier metal layer 122a protects the inter-metal dielectric layer 112 from penetration of metal components when the first via contact hole 120a is filled with a first upper metal interconnection layer pattern 124a. The first barrier metal layer 122a also has other undisclosed advantages in addition to the above. Beneficially, the first barrier metal layer 122a is a single layer or a multi-layer that includes at least a metal layer selected from a group consisting of a tantalum layer, a tantalum nitride layer, a titanium layer, and a titanium nitride layer.

The first upper metal interconnection layer pattern 124a is disposed on the first barrier metal layer 122a. The first upper metal interconnection layer pattern 124a completely fills the first via contact hole 120a and the first trench 118a. The first upper metal interconnection layer pattern 124a may be a copper layer pattern.

A second barrier metal layer 122b is disposed on exposed surfaces of the second via contact hole 120b, the second trench 118b, and the second lower metal interconnection layer pattern 108b. The second barrier metal layer 122b provides the same advantages as the first barrier metal layer 122a. Beneficially, the second barrier metal layer 122b protects the inter-metal dielectric layer 112 from penetration of metal components when the second via contact hole 120b is filled with a second upper metal interconnection layer pattern 124b. The second barrier metal layer 122b also has other undisclosed advantages in addition to the above. The second barrier metal layer 122b is also a single layer or a multi-layer that includes at least a metal layer selected from the group consisting of a tantalum layer, a tantalum nitride layer, a titanium layer, and a titanium nitride layer.

The second upper metal interconnection layer pattern 124b is disposed on the second barrier metal layer 122b. The second upper metal interconnection layer pattern 124b may be a copper layer pattern. The second upper metal interconnection layer pattern 124b completely fills the second via contact hole 120b, but only partially fills the second trench 118b. As a result, a third trench 126 is formed by the second upper metal interconnection layer pattern 124b in the second trench 118b. The third trench 126 naturally has a narrower width or a cross-sectional area than the second trench 118b. A void diffusion barrier layer 128 is formed in the third trench 126 on the second upper metal interconnection layer pattern 124b. A third upper metal interconnection layer pattern 130b filling the third trench 126 is disposed on the void diffusion barrier layer 128. The third upper metal interconnection layer pattern 130b can be a copper layer pattern like the second upper metal interconnection layer pattern 124b. Although not seen in FIG. 1, beneficially, the third upper metal interconnection layer pattern 130b is at least five times thicker than the second upper metal interconnection layer pattern 124b. Preferably, the second upper metal interconnection layer pattern 124b is approximately 1,000 Å thick, and the third upper metal interconnection layer pattern 130b is approximately 7,000 Å thick. The void diffusion barrier layer 128 prevents diffusion of voids in the third upper metal interconnection layer pattern 130b to the second via contact hole 120b. Beneficially, the void diffusion barrier layer 128 is a single layer or a multi-layer that includes at least a metal layer selected from a group consisting of a tantalum layer, a titanium layer, and an aluminum layer.

The metal interconnection structure can be formed by using a dual damascene process. It has been described that when an upper metal interconnection layer pattern is formed with a large width or cross-sectional area, voids within the upper metal interconnection pattern can migrate into the via contact hole and can form a large void in the via contact hole due to a stress gradient. However, in the metal interconnection structure of FIG. 1, the first upper metal interconnection layer pattern 124a has a relatively narrow width or cross-sectional area. Therefore, void density in the first upper metal interconnection layer pattern 124a is not so high as to migrate into the first via contact hole 120a even though some voids exist. However, the second and the third upper metal interconnection layer patterns 124b and 130 have a relatively large width or cross-sectional area, compared to the first upper metal interconnection layer pattern 124a, so voids in the second and the third upper metal interconnection layer patterns 124b and 130 can diffuse into the second via contact hole 120b due to high void density of the second and the third upper metal interconnection layer patterns 124b and 130.

In the metal interconnection structure of FIG. 1, a void does not occur in the first via contact hole 120a even if there is no void diffusion barrier layer because of a relatively narrow width or cross-sectional area, i.e., a low void density region, as shown in FIG. 1. In FIG. 1, in that portion of the metal interconnection structure has a relatively large width or cross-sectional area, i.e., a high void density region, a void also does not occur due to the void diffusion barrier layer 128 disposed between the second upper metal interconnection layer pattern 124b and the third upper metal interconnection layer pattern 130b. The void diffusion barrier layer 128 blocks the voids that exist in the third upper metal interconnection layer pattern 130b from diffusing into the second via contact hole 120b.

Figure 2:
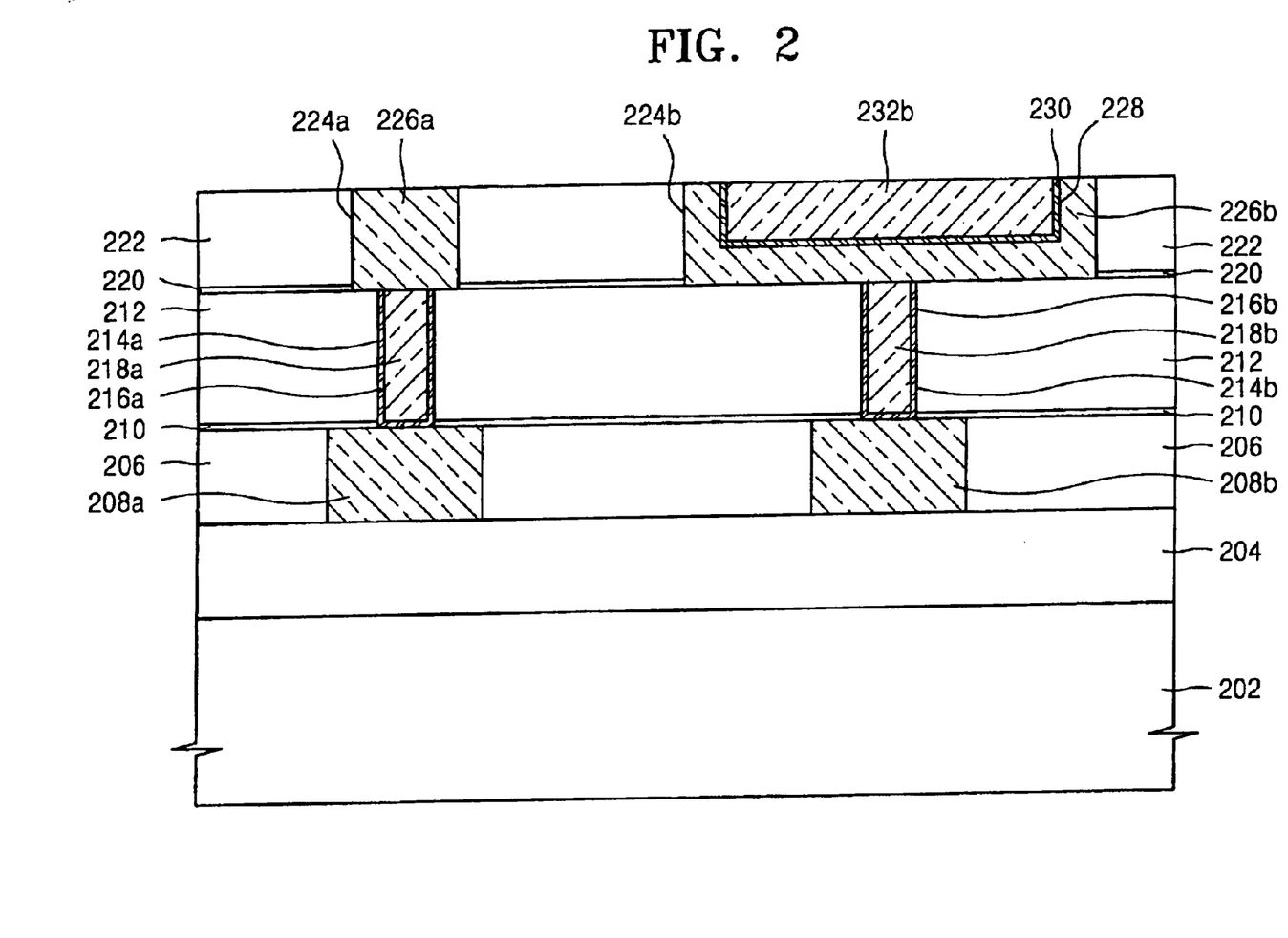
FIG. 2 is a cross-sectional view of a second embodiment of a metal interconnection structure.

FIG. 2 is a cross-sectional view of a second embodiment of a metal interconnection structure. The interconnection structure depicted in FIG. 2 is different from the interconnection structure depicted in FIG. 1 in that the metal interconnection structure in FIG. 1 is formed by a dual damascene process while the interconnection structure in FIG. 2 is formed by a single damascene process.

Referring to FIG. 2, a first lower metal interconnection layer pattern 208a and a second lower metal interconnection layer pattern 208b are disposed with a distance therebetween in a first inter-layer dielectric layer 206. In FIG. 2, the first lower metal interconnection layer pattern 208a and the second lower metal interconnection layer pattern 208b are separated. However, they can be connected in other parts. Also, the first lower metal interconnection layer pattern 208a and the second lower metal interconnection layer pattern 208b are separated from a semiconductor substrate 202 by an dielectric layer 204 interposed therebetween, but, in general, the first and second lower metal interconnection layer pattern 208a and 208b can be connected to a predetermined region, such as an active region, in the substrate 202 via a contact. The first and second lower metal interconnection layer patterns 208a and 208b may be a copper layer pattern.

An inter-metal dielectric layer 212 is disposed on the first inter-layer dielectric layer 206, the first lower metal interconnection layer pattern 208a, and the second lower metal interconnection layer pattern 208b. The inter-metal dielectric layer 212 is a low dielectric constant material layer having a dielectric constant less than 3. The inter-metal dielectric layer 212 has a first via contact hole 214a and a second via contact hole 214b. The first via contact hole 214a exposes a portion of the first lower metal interconnection layer pattern 208a through the inter-metal dielectric layer 212. The second via contact hole 214b exposes a portion of the second lower metal interconnection layer pattern 208b through the inter-metal dielectric layer 212. A first etch stop layer 210 is disposed under the inter-metal dielectric layer 212 and limits etching when etching the first via contact hole 214a and the second via contact hole 214b.

A first barrier metal layer 216a is disposed on exposed surfaces of the first via contact hole 214a and the first lower metal interconnection layer pattern 208a. Beneficially, the first barrier metal layer 216a is a single layer or a multi-layer that includes at least a metal layer selected from a group consisting of a tantalum layer, a tantalum nitride layer, a titanium layer, and a titanium nitride layer. A first via contact 218a is formed on the first barrier metal layer 216a. The first via contact 218a formed of the conductive material layer connects the upper and the lower metal interconnections, and completely fills the first via contact hole 214a. A second barrier metal layer 216b is disposed on exposed surfaces of the second via contact hole 214b and the second lower metal interconnection layer pattern 208b. Beneficially, the second barrier metal layer 216b is a single layer or a multi-layer layer that includes at least a metal layer selected from the group consisting of a tantalum layer, a tantalum nitride layer, a titanium layer, and a titanium nitride layer. A second via contact 218b is formed on the second barrier metal layer 216b. The second via contact 218b formed of a conductive material layer connects the upper and the lower metal interconnections, and completely fills the second via contact hole 214b.

A second inter-layer dielectric layer 222 is disposed on the inter-metal dielectric layer 212. The second inter-layer dielectric layer 222 has a first trench 224a and a second trench 224b. The first trench 224a exposes an upper surface of the first via contact 218a and a portion of the inter-metal dielectric layer 212 through the second inter-layer dielectric layer 222. The second trench 224b exposes an upper surface of the second via contact 218b and a portion of the inter-metal dielectric layer 212 through the second inter-layer dielectric layer 222. The second trench 224b has a much larger width or cross-sectional area than the first trench 224b. Accordingly, the void density of the two trenches 224a and 224b are different. A second etch stop layer 220 is disposed under the second inter-layer dielectric layer 222 and limits etching when etching for making the first trench 224a and the second trench 224b.

A first upper metal interconnection layer pattern 226a is disposed in the first trench 224a. A lower surface of the first upper metal interconnection layer pattern 226a contacts with an upper surface of the first via contact 218a. The first upper metal interconnection layer pattern 226a may be a copper layer pattern. A second upper metal interconnection layer pattern 226b, a void diffusion barrier layer 230, and a third upper metal interconnection layer pattern 232b are sequentially disposed in the second trench 224b. The second upper metal interconnection layer pattern 226b may be a copper layer pattern. A lower surface of the second upper metal interconnection layer pattern 226b contacts an upper surface of the second via contact 218b, and partially fills the second trench 224b. As a result, a third trench 228 is formed in the second trench by the second upper metal interconnection layer pattern 226b. The third trench 228 naturally has a narrower width or cross-sectional area than the second trench 224b. A void diffusion barrier layer 230 is formed in the third trench 228 on the second upper metal interconnection layer pattern 226b, and a third upper metal interconnection layer pattern 232b is formed on the void diffusion barrier layer 230 completely filling the third trench 228. The third upper metal interconnection layer pattern 232b may be a copper layer pattern like the second upper metal interconnection layer pattern 226b. Although not seen in FIG. 2, beneficially, the thickness of the third upper metal interconnection layer pattern 232b is at least five times greater than the thickness of the second upper metal interconnection layer pattern 226b. Preferably, the second upper metal interconnection layer pattern 226b is approximately 1,000 Å thick, and the third upper metal interconnection layer pattern 232b is approximately 7,000 Å thick. The void diffusion barrier layer 230 prevents voids in the third upper metal interconnection layer pattern 232b from diffusing into the second via contact 218b, as explained above. Beneficially, the void diffusion barrier layer 230 is a single layer or a multi-layer that includes at least a metal layer selected from a group consisting of a tantalum layer, a titanium layer, and an aluminum layer.

FIG. 3 through 6 are cross-sectional views for describing a first embodiment of a method of forming a metal interconnection structure, in which a dual damascene process is used.

Figure 3:
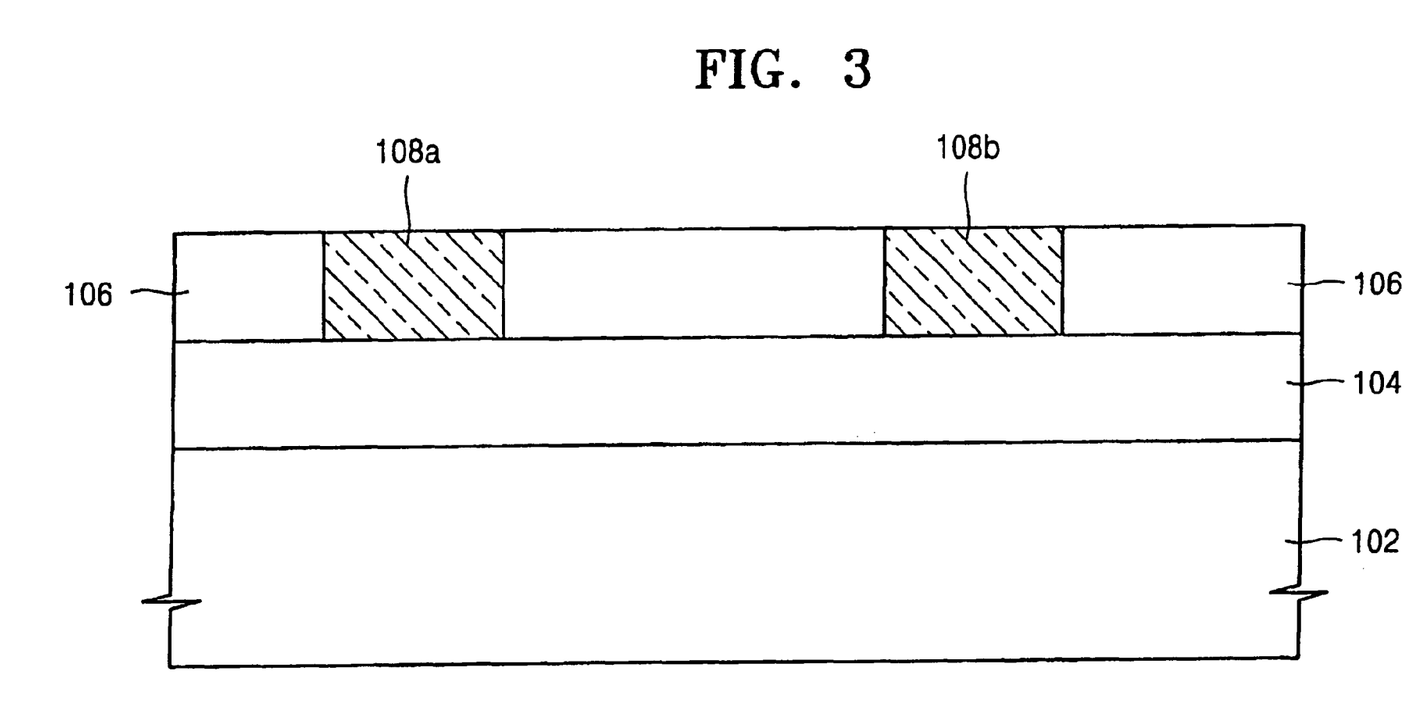
FIGS. 3 through 6 are cross-sectional views for describing a method of forming a metal interconnection structure according to a first embodiment.

Referring to FIG. 3, a first lower metal interconnection layer pattern 108a and a second lower metal interconnection layer pattern 108b are formed with a distance therebetween in a first inter-layer dielectric layer 106. In FIG. 3, the first lower metal interconnection layer pattern 108a and the second lower metal interconnection layer pattern 108b are separated from a semiconductor substrate 102 by a dielectric layer 104 interposed therebetween, however in general, the first and second lower metal interconnection layer pattern 108a and 108b can be electrically connected to a predetermined region, such as an active region, of the substrate 102 via a contact Also, a plurality of different layers can be disposed between the first and second lower metal interconnection layer pattern 108a and 108b, and the semiconductor substrate 102. The first and second lower metal interconnection layer patterns 108a and 108b can be formed of a copper layer pattern.

Figure 4:
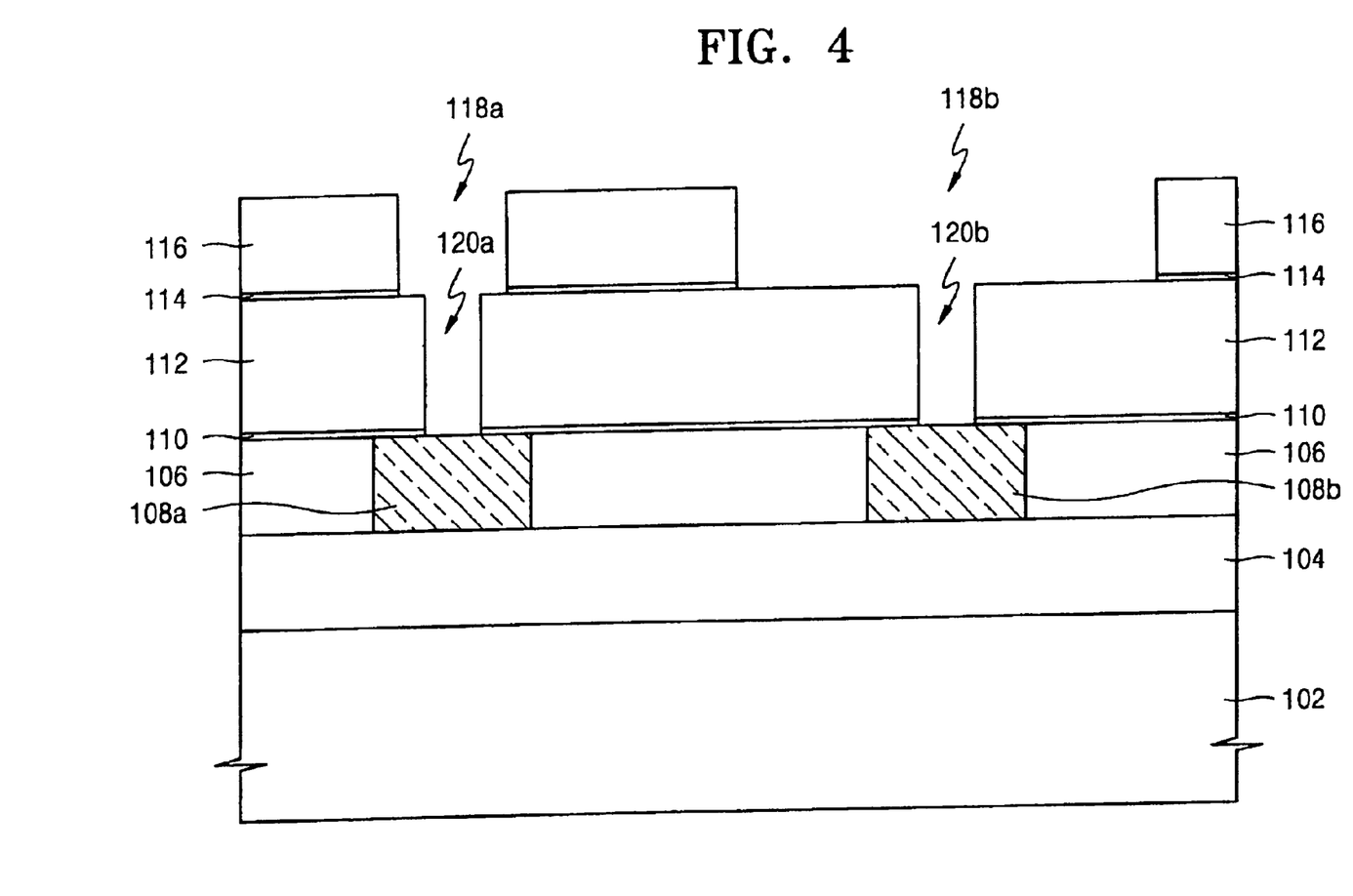

Referring to FIG. 4, an inter-metal dielectric layer 112 having a first via contact hole 120a and a second via contact hole 120b is formed on the first lower metal interconnection layer pattern 108a, the second lower metal interconnection layer pattern 108b and the first inter-layer dielectric layer 106. A second inter-layer dielectric layer 116 having a first trench 118a and a second trench 118b is formed on the inter-metal dielectric layer 112. For this purpose, a first etch stop layer 110, the inter-metal dielectric layer 112, a second etch stop layer 114, and a second inter-layer dielectric layer 116 are sequentially formed on the first inter-layer dielectric layer 106. Then, a first mask layer pattern (not shown) is formed on the second inter-layer dielectric layer 116. The first mask layer pattern exposes portions of the second inter-layer dielectric layer 116 in which the first trench 118a and the second trench 118b are to be formed. Next, the exposed portion of the second inter-layer dielectric layer 116 is etched using the first mask layer pattern as an etch mask. The etching process is continued until portions of an upper surface of the second etch stop layer 114 is exposed. Thus, the first trench 118a having a relatively narrow width and the second trench 118b having a relatively wide width are formed. The first mask layer pattern and the exposed second etch stop layer 114 are removed, thereby exposing portions of an upper surface of the inter-metal dielectric layer 112. If necessary, the first mask layer pattern can be removed after removing the second etch stop layer 114. Next, a second mask layer pattern (not shown) is formed on the surface of the resultant product. The second mask layer pattern exposes portions of the inter-metal dielectric layer 112 in which the first via contact hole 120a and the second via contact hole 120b are to be formed. The exposed portion of the inter-metal dielectric layer 112 is then etched using the second mask layer pattern as an etch mask. The etching process can be continued until a portion of the first etch stop layer 110 is exposed. Thus, the first via contact hole 120a and the second via contact hole 120b are formed in the first trench 118a and the second trench 118b, respectively. The second mask layer pattern and exposed portions of the first etch stop layer 110 are removed, thereby exposing a portion of each of the first metal interconnection layer 108a and the second metal interconnection layer 108b. If necessary, the second mask layer pattern can be removed after removing the first etch stop layer 110.

Figure 5:
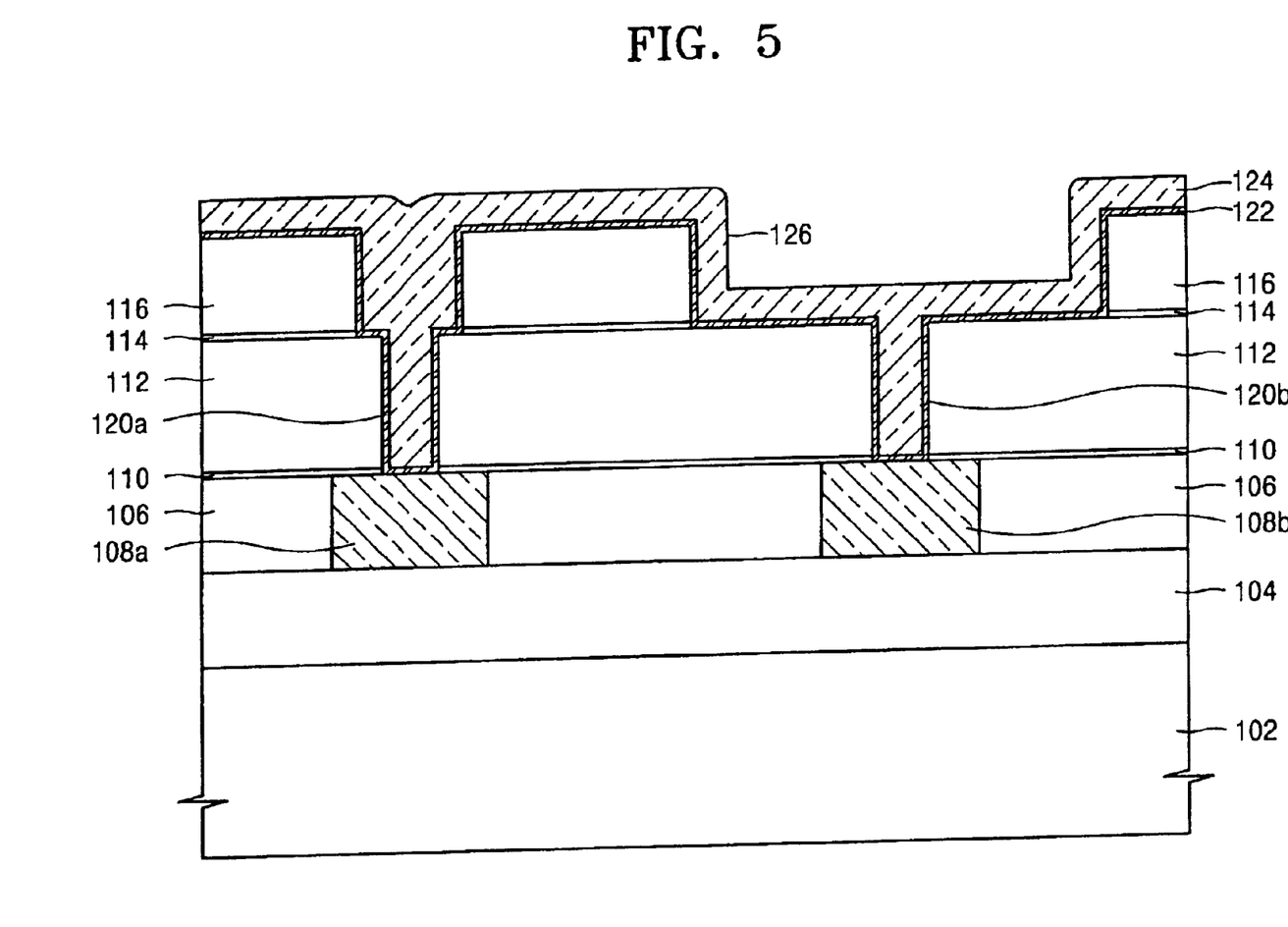

Referring to FIG. 5, a barrier metal layer 122 is formed on the entire surface of the resultant product. Beneficially, the barrier metal layer 122 is formed of at least one material layer selected from the group consisting of a tantalum layer, a tantalum nitride layer, a titanium layer, and a titanium nitride layer.

Next, a first upper metal interconnection layer 124 is formed using an electroplating method. That is, after forming a metal seed layer on the surface of the resultant product, metal ions from the plating solution are deposited on the metal seed layer due to a chemical reaction between the metal seed layer which acts as a cathode, and the plating solution. The first via contact hole 120a and the second via contact hole 120b are completely filled with the first upper metal interconnection layer 124. The first trench 118a is also completely filled with the first upper metal interconnection layer 124 since it has a relatively small width or cross-sectional area. However, the second trench 118b having a relatively large width or cross-sectional area is not completely filled with the first upper metal interconnection layer 124, and thus, a third trench 126 is formed in the second trench 118b.

Figure 6:
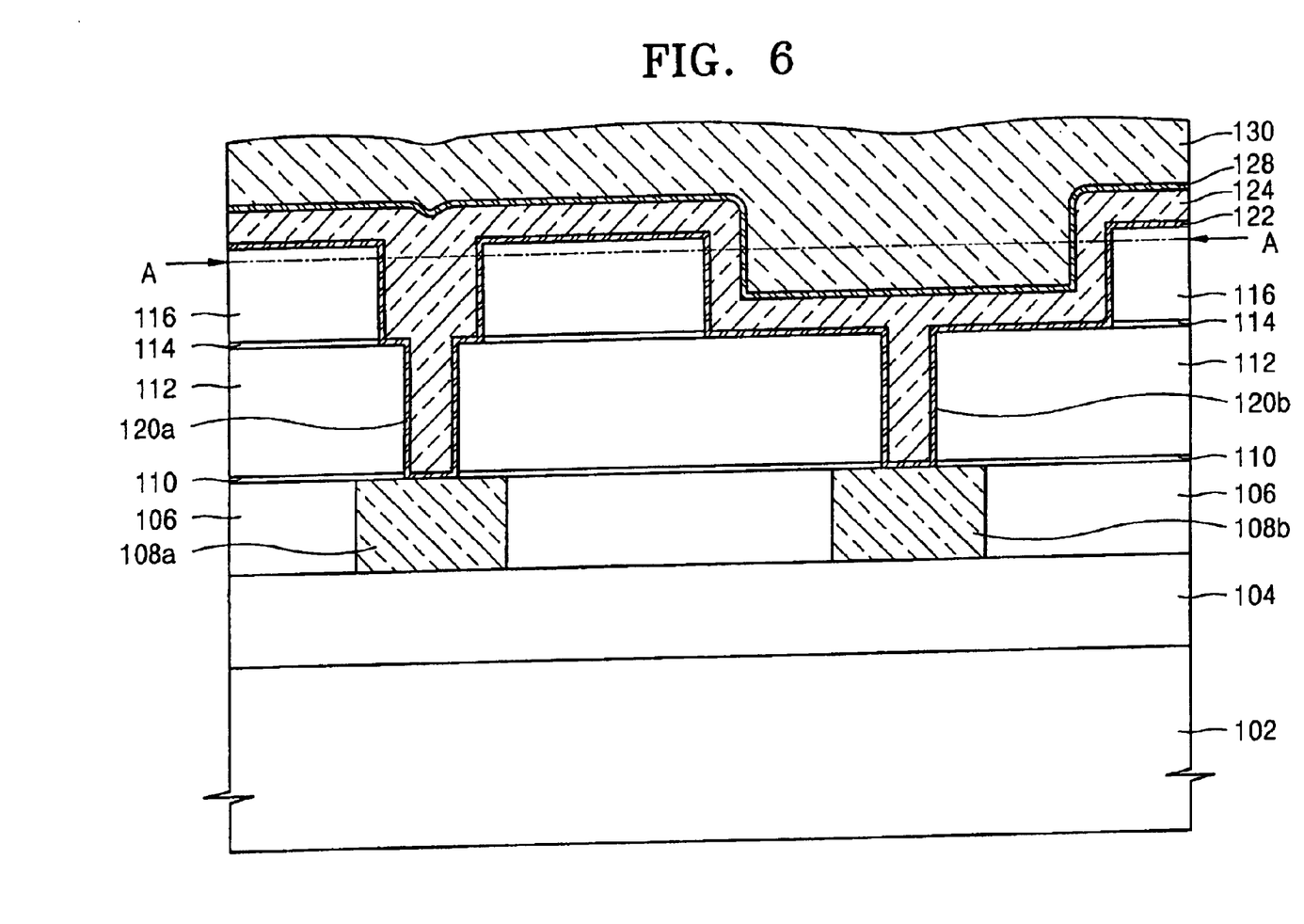

Referring to FIG. 6, a void diffusion barrier layer 128 and a second upper metal interconnection layer 130 are sequentially formed on the first upper metal interconnection layer 124. The void diffusion barrier layer 128 prevents diffusion of voids in the second upper metal interconnection layer 130 into the second via contact hole 120b through the first upper metal interconnection layer 124. Beneficially, the void diffusion barrier 128 is formed of at least one material layer selected from a group consisting of a tantalum layer, a titanium layer, and an aluminum layer. The aluminum layer is particularly effective for preventing the diffusion of segregated voids in a crystal structure. Beneficially, the void diffusion barrier layer 128 is formed by Physical Vapor Deposition (PVD), Chemical Vapor Deposition (CVD), or Atomic Layer Deposition (ALD). A planarization process is preformed after forming the void diffusion barrier layer 128 and the second upper metal interconnection layer 130. Layers above a dotted line A in FIG. 6 are completely removed by Chemical Mechanical Polishing (CMP). Then, as depicted in FIG. 1, the first upper metal interconnection layer 124 is divided into a first upper metal interconnection layer pattern 124a disposed in the first via contact hole 120a and the first trench 118a, and a second upper metal interconnection layer pattern 124b disposed in the second via contact hole 120b and the second trench 118b. The second upper metal interconnection layer 130 remains as a third upper metal interconnection layer pattern 130b in the third trench 126.

Figure 7:
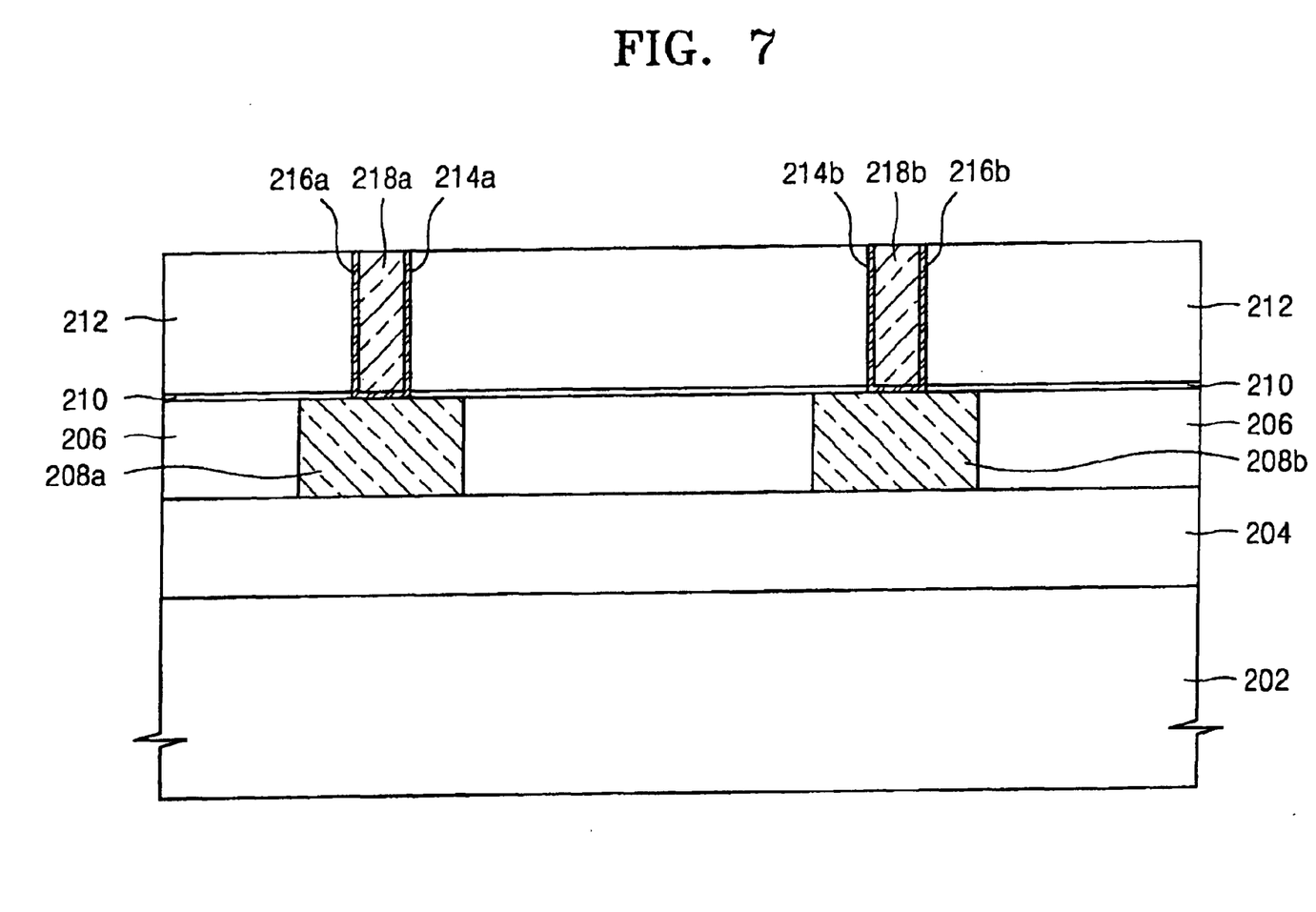
FIGS. 7 through 9 are cross-sectional views for describing a method of forming a metal interconnection structure according to a second embodiment of the present invention.
Figure 8:
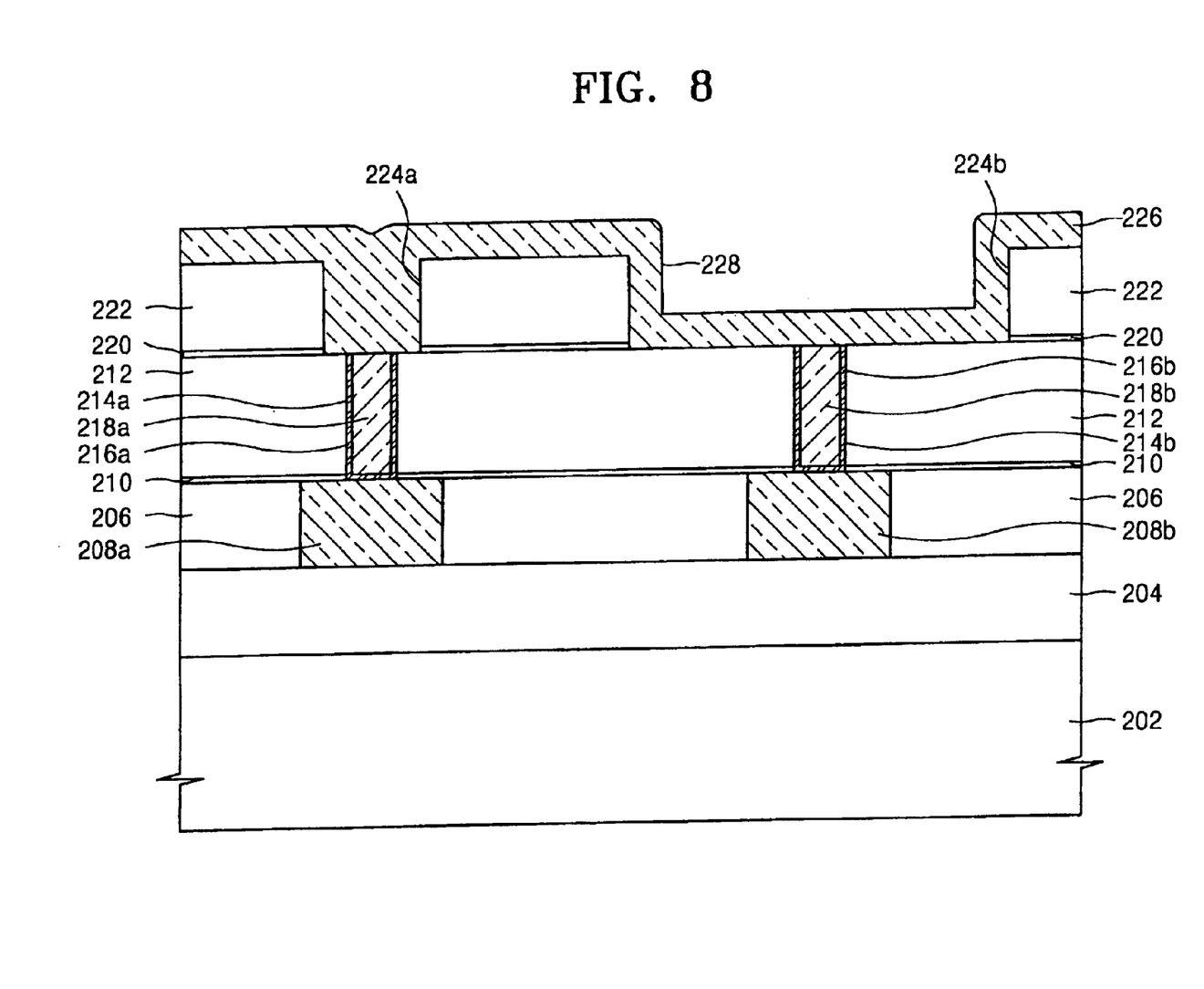
Figure 9:
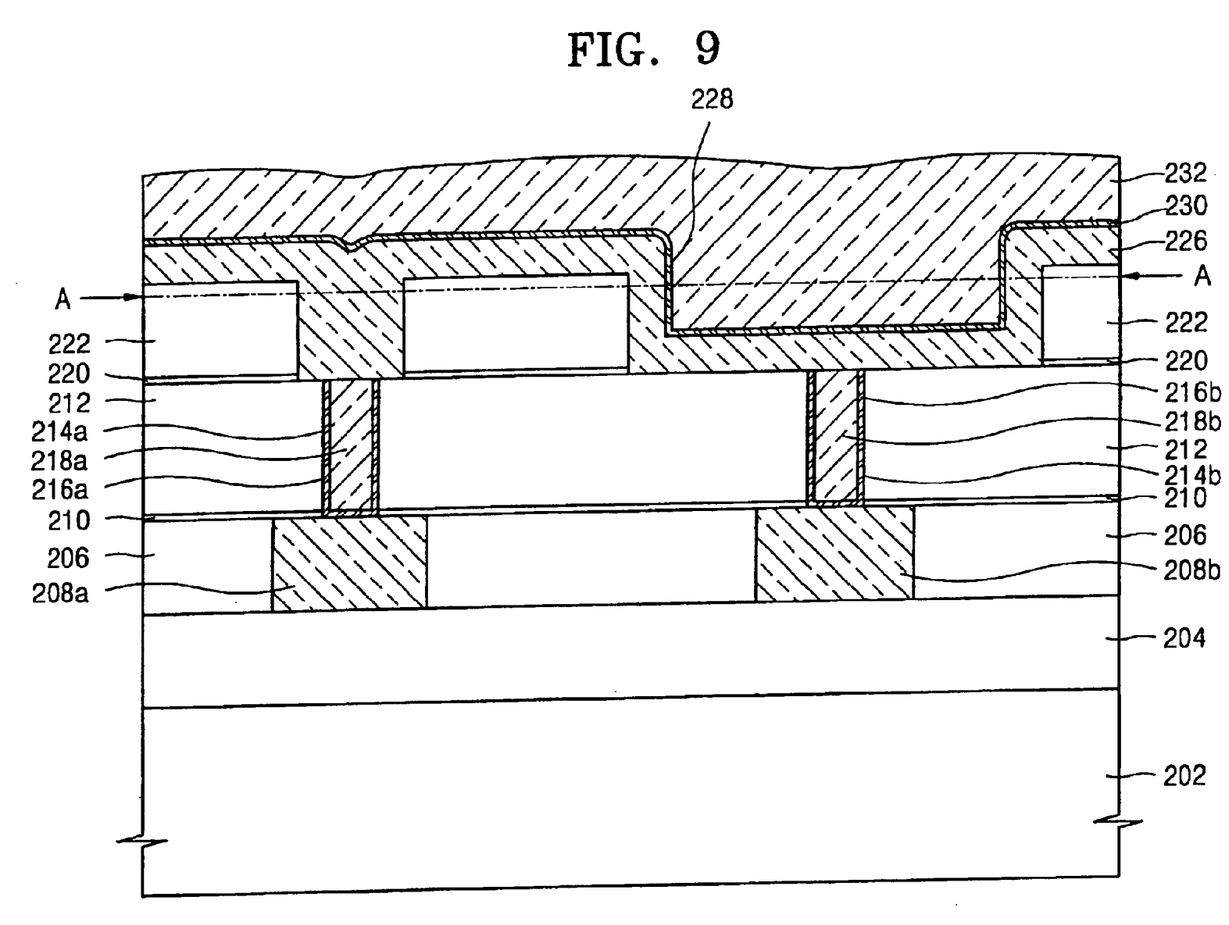

FIGS. 7 through 9 are cross-sectional views for describing a second embodiment of a method of forming a metal interconnection, in which a single damascene process is used.

Referring to FIG. 7, a first lower metal interconnection layer pattern 208a and a second lower metal interconnection layer pattern 208b with a distance therebetween are formed in an inter-layer dielectric layer 202. In the present embodiment, the first and second lower metal interconnection layer pattern 208a and 208b are electrically connected to a predetermined region, such as an active region, in the semiconductor substrate 202. Also, a plurality of layers can be formed between the first and second lower metal interconnection layer pattern 208a and 208b and the semiconductor substrate 202 in addition to the dielectric layer 204. The first and second lower metal interconnection layer patterns 208a and 208b can be formed of a copper layer pattern.

Next, a first etch stop layer 210 and a inter-metal dielectric layer 212 are sequentially formed on the first inter-layer dielectric layer 206, the first lower metal interconnection layer pattern 208a, and the second lower metal interconnection layer pattern 208b. Portions of the inter-metal dielectric layer 212 are etched using a predetermined etch mask layer pattern. The etching process is continued until portions of surface of the first etch stop layer 210 are exposed. When the first etch stop layer 210 is removed, a first via contact hole 214a that exposes a portion of the first lower metal interconnection layer pattern 208a, and a second via contact hole 214b that exposes a portion of the second lower metal interconnection layer pattern 208b are formed. Next, a barrier metal layer is formed on the resultant surface, and a metal layer for a contact hole is formed on the barrier metal layer, filling the first via contact hole 214a and the second via contact hole 214b. Beneficially, the barrier metal layer is formed of a material layer selected from the group consisting of a tantalum layer, a tantalum nitride layer, a titanium layer, and a titanium nitride layer. A surface of the inter-metal dielectric layer 212 is exposed by performing a first planarization process. Then, the barrier metal layer is divided into the first barrier metal layer 216a in the first via contact hole 214b, and the second barrier metal layer 216b in the second via contact hole 214b. The metal layer for the contact hole is also divided into a first via contact 218a in the first via contact hole 214a and a second via contact 218b in the second via contact hole 214b.

Referring to FIG. 8, a second etch stop layer 220 and a second inter-layer dielectric layer 222 are sequentially formed on the inter-metal dielectric layer 212. Portions of the second inter-layer dielectric layer 222 are etched using a predetermined etch mask layer pattern. The etching process is continued until portions of an upper surface of the second etch stop layer 220 are exposed. By removing the exposed portions of the second etch stop layer 220, a first trench 224a that completely exposes an upper surface of the first via contact 218a, and a second trench 224b that completely exposes an upper surface of the second via contact 218b are formed. A width or cross-sectional area of the first trench 224a is smaller than that of the second trench 224b. A first upper metal interconnection layer 226 is formed on the entire surface of the resultant product. The first upper metal interconnection layer 226 is formed using an electroplating method. That is, after forming a metal seed layer on the surface of the resultant product, metal ions from a plating solution are deposited on the metal seed layer due to a chemical reaction between the metal seed layer, which acts as a cathode, and the plating solution. The first trench 224a is completely filled with the first upper metal interconnection layer 226 since it has a relatively narrow width or cross-sectional area. However, the second trench 224b, which has a relatively large width or cross-sectional area, is not completely filled with the first upper metal interconnection layer 226, and therefore, a third trench 228 is formed in the second trench 224b.

Referring to FIG. 9, a void diffusion barrier layer 230 and a second upper metal interconnection layer 232 are sequentially formed on the first upper metal interconnection layer 226. The void diffusion barrier layer 230 prevents diffusion of voids in the second upper metal interconnection layer 232 into the second via contact 218b through the first upper metal interconnection layer 226. Beneficially, the void diffusion barrier layer 230 is formed of at least one material layer selected from a group consisting of a tantalum layer, a titanium layer, and an aluminum layer. The aluminum layer is particularly effective for preventing diffusion of segregated voids in a crystal structure. Beneficially, the void diffusion barrier layer 230 is formed by PVD, CVD, or ALD. A planarization process is preformed after forming the void diffusion barrier layer 230 and the second upper metal interconnection layer 232. Layers above a dotted line A—A are completely removed by a CMP process. Then, as depicted in FIG. 2, the first upper metal interconnection layer 226 is divided into a first upper metal interconnection pattern 226a filled in the first trench 224a, and a second upper metal interconnection pattern 226b disposed in the second trench 228b. The second upper metal interconnection layer 232 remains as a third upper metal interconnection layer pattern 232 in the third trench 228.

As described above, a metal interconnection structure and a method of forming a metal interconnection prevent the diffusion of voids due to a stress gradient from an upper metal interconnection layer pattern into a via contact formed below the upper metal interconnection layer pattern, thereby improving reliability of a semiconductor device.

While this invention has been particularly shown and described with reference to exemplary embodiments thereof, it will be understood by those of ordinary skill in the art that various changes in form and details may be made therein without departing from the spirit and scope of the invention as defined by the appended claims.

What is claimed is:

1. A metal interconnection structure, comprising:
a lower metal interconnection layer pattern disposed in a first inter-layer dielectric layer;
an inter-metal dielectric layer on the first inter-layer dielectric layer and the lower metal interconnection layer pattern, the inter-metal dielectric layer having a via contact hole that exposes a portion of an upper surface of the lower metal interconnection layer pattern;
a second inter-layer dielectric layer on the inter-metal dielectric layer, the second inter-layer dielectric layer having a trench that exposes a portion of the via contact hole;
a barrier metal layer on exposed lateral surfaces of the via contact hole and the exposed portion of the upper surface of the lower metal interconnection layer pattern;
a first upper metal interconnection layer pattern having a first thickness on the barrier metal layer, the first upper metal interconnection layer pattern completely filling the via contact hole and partially filling the trench;
a void diffusion barrier layer on the first upper metal interconnection layer pattern; and
a second upper metal interconnection layer pattern that completely fills the trench on the void diffusion barrier layer.

2. The metal interconnection structure of claim 1, wherein the lower metal interconnection layer pattern, the first upper metal interconnection layer pattern, and the second upper metal interconnection layer pattern comprise copper.

3. The metal interconnection structure of claim 1, wherein the inter-metal dielectric layer is a low dielectric constant material layer having a dielectric constant less than 3.

4. The metal interconnection structure of claim 1, wherein the barrier metal layer comprises at least one material layer selected from the group consisting of a tantalum layer, a tantalum nitride layer, a titanium layer, and a titanium nitride layer.

5. The metal interconnection structure of claim 1, wherein the void diffusion barrier layer comprises at least one material layer selected from the group consisting of a tantalum layer, a titanium layer, and an aluminum layer.

6. The metal interconnection structure of claim 1, wherein the second upper metal interconnection layer pattern is at least five times thicker than the first upper metal interconnection layer pattern.

7. A metal interconnection structure, comprising:
first and second lower metal interconnection layer patterns disposed in a first inter-layer dielectric layer with a distance therebetween;
an inter-metal dielectric layer on the first inter-layer dielectric layer and the first and second lower metal interconnection layer patterns, the inter-metal dielectric layer having a first via contact hole that exposes a portion of a surface of the first lower metal interconnection layer pattern, and a second via contact hole that exposes a portion of a surface of the second lower metal interconnection layer pattern;
a second inter-layer dielectric layer on the inter-metal dielectric layer, the second inter-layer dielectric layer having a first trench that exposes the first via contact hole, and a second trench that exposes the second via contact hole and has a larger width than the first trench;
a first barrier metal layer on inner surfaces of the first trench and the first via contact hole, and on the exposed portion of the surface of the first lower metal interconnection layer pattern;
a first upper metal interconnection pattern on the first barrier metal layer, the first upper metal interconnection pattern filling the first trench and the first via contact hole;
a second barrier metal layer on inner surfaces of the second trench and second via contact and on the exposed portion of the surface of the second lower metal interconnection layer pattern;
a second upper metal interconnection layer pattern on the second barrier metal layer and having a third trench therein, the second upper metal interconnection layer pattern filling the second via contact hole and a portion of the second trench;
a void diffusion barrier layer on the second upper metal interconnection layer pattern; and
a third upper metal interconnection layer pattern on the void diffusion barrier layer, the third upper metal interconnection layer pattern filling the third trench.

8. A metal interconnection structure, comprising:
a lower metal interconnection layer pattern disposed in a first inter-layer dielectric layer;
an inter-metal dielectric layer on the first inter-layer dielectric layer and the lower metal interconnection layer pattern, the inter-metal dielectric layer having a via contact hole that exposes a portion of the lower metal interconnection layer pattern;
a barrier metal layer on exposed surfaces of the via contact hole and the exposed portion of the lower metal interconnection layer pattern;
a via contact that fills the via contact hole and is disposed on the barrier metal layer;
a second inter-layer dielectric layer that has a trench that exposes a portion of the inter-metal dielectric layer and an upper surface of the via contact, and is disposed on the inter-metal dielectric layer and the via contact;
a first upper metal interconnection layer pattern having a first thickness that fills the via contact and a portion of the trench of the second inter-layer dielectric layer;
a void diffusion barrier layer on the first upper metal interconnection layer pattern; and
a second upper metal interconnection layer pattern having a second thickness that completely fills the trench and is disposed on the void diffusion barrier layer.

9. The metal interconnection structure of claim 8, wherein a thickness of the second upper metal interconnection layer pattern is at least five times greater than a thickness of the first upper metal interconnection layer pattern.

10. A metal interconnection structure comprising:
first and second lower metal interconnection layer patterns disposed in a first inter-layer dielectric layer with a distance therebetween;
an inter-metal dielectric layer on the first inter-layer dielectric layer and the first and second lower metal interconnection layer patterns, the inter-metal dielectric layer having a first via contact hole that exposes a portion of the first lower metal interconnection layer pattern and a second via contact hole that exposes a portion of the second lower metal interconnection layer pattern;
first and second barrier metal layers in the first via contact hole and the second via contact hole, respectively;
first and second via contacts that respectively fill the first and second via contact holes, and are disposed on the first and second barrier metal layers;

a second inter-layer dielectric layer that is disposed on the inter-metal dielectric layer and has a first trench that exposes an upper surface of the first via contact and a second trench that exposes an upper surface of the second via contact;

a first upper metal interconnection layer pattern that fills the first trench;

a second upper metal interconnection layer pattern that forms a third trench in the second trench by filling a portion of the second trench;

a void diffusion barrier layer on the second upper metal layer pattern; and a third upper metal interconnection layer pattern that fills the third trench and is disposed on the void diffusion barrier layer.

11. A method of forming a metal interconnection structure, comprising:

forming first and second lower metal interconnection layer patterns with a distance between each other in a first inter-layer dielectric layer;

forming an inter-metal dielectric layer on the first inter-layer dielectric layer and the first and second lower metal interconnection layer patterns;

forming a second inter-layer dielectric layer on the inter-metal dielectric layer;

forming first and second trenches that expose portions of the inter-metal dielectric layer by etching portions of the second inter-layer dielectric layer;

forming a first contact hole that exposes a portion of the first lower metal interconnection layer pattern in the first trench, and a second contact hole that exposes a portion of the second lower metal interconnection layer pattern, by etching the portions of the inter-metal dielectric layer exposed by the first and second trenches;

forming a barrier metal layer on inner surfaces of the first trench, the second trench, the first contact hole, and the second contact hole, and on exposed surfaces of the first and second lower metal interconnection layer patterns;

forming a first upper metal interconnection layer on the barrier metal layer, thereby filling the first contact hole, the second contact hole and the first trench, and partially filling the second trench, thereby forming a third trench;

forming a void diffusion barrier layer on a portion of the first upper metal interconnection layer that has the third trench;

forming a second upper metal interconnection layer on the void diffusion barrier layer, thereby filling the third trench; and dividing the first upper metal interconnection layer in the first trench from the first upper metal interconnection layer in the second trench and the second upper metal interconnection layer in the third trench by removing portions of the first upper metal interconnection layer, the void diffusion barrier layer, and the second upper metal interconnection layer.

12. The method of claim 11, wherein the inter-metal dielectric layer is formed of a low dielectric constant material having a dielectric constant less than 3.

13. The method of claim 11, wherein the first trench is narrower than the second trench.

14. The method of claim 11, wherein the barrier metal layer is formed of at least one metal layer selected from a group consisting of a tantalum layer, a tantalum nitride layer, a titanium layer, and a titanium nitride layer.

15. The method of claim 11, wherein the first upper metal interconnection layer is formed by an electroplating method.

16. The method of claim 11, wherein the void diffusion barrier layer is formed of at least one material layer selected from a group consisting of a tantalum layer, a titanium layer, and an aluminum layer.

17. The method of claim 11, wherein the void diffusion barrier layer is formed by using PVD, CVD, or ALD.

18. The method of claim 11, wherein removing portions of the first upper metal interconnection layer, the void diffusion barrier layer, and the second upper metal interconnection layer comprises performing a CMP process.

19. The method of claim 11, wherein the first and second upper metal interconnection layers comprise copper.

20. A method of forming a metal interconnection structure, comprising:

forming first and second lower metal interconnection layer patterns with a distance therebetween in a first inter-layer dielectric layer;

forming an inter-metal dielectric layer on the first inter-layer dielectric layer and the first and second lower metal interconnection layer patterns;

forming a first contact hole and a second contact hole that expose the first and second lower metal interconnection layer patterns, respectively, by removing a portion of the inter-metal dielectric layer;

forming a barrier metal layer on exposed surfaces of the inter-metal dielectric layer and the first and second lower metal interconnection layer patterns;

forming a metal layer on the barrier metal layer, filling the first contact hole and the second contact hole;

dividing the metal layer into a first via contact in the first contact hole and a second via contact in the second contact hole by planarization;

forming a second inter-layer dielectric layer on the inter-metal dielectric layer, the first via contact, and the second via contact;

forming a first trench and a second trench that expose portions of upper surfaces of the first via contact and the second via contact, respectively, by removing portions of the second inter-layer dielectric layer;

forming a first upper metal interconnection layer that completely fills the first trench and fills a portion of the second trench, forming a third trench therein;

forming a void diffusion barrier layer on the first upper metal interconnection including the third trench;

forming a second upper metal interconnection layer on the void diffusion barrier layer, filling the third trench; and dividing the first upper metal interconnection layer in the first trench from the first upper metal interconnection layer in the second trench and the second upper metal interconnection layer in the third trench by planarizing.

* * * * *